(12) United States Patent
Miyake (10) Patent No.: US 11,757,009 B2
(45) Date of Patent: Sep. 12, 2023

(54) SEMICONDUCTOR DEVICE AND METHOD FOR MANUFACTURING THE SAME

(71) Applicants: DENSO CORPORATION, Kariya (JP); MIRISE Technologies Corporation, Nisshin (JP); TOYOTA JIDOSHA KABUSHIKI KAISHA, Toyota (JP)

(72) Inventor: Hiroki Miyake, Nisshin (JP)

(73) Assignees: DENSO CORPORATION, Kariya (JP); MIRISE Technologies Corporation, Nisshin (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 36 days.

(21) Appl. No.: 17/398,060

(22) Filed: Aug. 10, 2021

(65) Prior Publication Data

US 2022/0093748 A1 Mar. 24, 2022

(30) Foreign Application Priority Data

Sep. 18, 2020 (JP) .................................. 2020-157824

(51) Int. Cl.
*H01L 29/36* (2006.01)
*H01L 29/24* (2006.01)
(Continued)

(52) U.S. Cl.
CPC ............ *H01L 29/36* (2013.01); *H01L 21/425* (2013.01); *H01L 29/24* (2013.01);
(Continued)

(58) Field of Classification Search
CPC . H01L 29/8613; H01L 29/872; H01L 29/861; H01L 29/36; H01L 29/0878
See application file for complete search history.

(56) References Cited

U.S. PATENT DOCUMENTS

2014/0230723 A1  8/2014  Masui et al.
2014/0332823 A1  11/2014  Takizawa et al.
(Continued)

OTHER PUBLICATIONS

Feng et al., "Influence of annealing atmosphere on the performance of a β-Ga2O3 thin film and photodetector", Optical Materials Express, vol. 8, No. 8, Aug. 1, 2018, pp. 1-9 (Year: 2018).*

(Continued)

*Primary Examiner* — Vincent Wall
(74) *Attorney, Agent, or Firm* — POSZ LAW GROUP, PLC (57) ABSTRACT

A semiconductor device includes: a first semiconductor layer having an N conductive type and made of a gallium oxide-based semiconductor; and a second semiconductor layer made of a gallium oxide-based semiconductor, in contact with the first semiconductor layer, and having the N conductive type with an electrically active donor concentration higher than an electrically active donor concentration of the first semiconductor layer. A difference between a donor concentration of the first semiconductor layer and a donor concentration of the second semiconductor layer is smaller than a difference between the electrically active donor concentration of the first semiconductor layer and the electrically active donor concentration of the second semiconductor layer.

4 Claims, 6 Drawing Sheets

(51) Int. Cl.
  *H01L 21/425* (2006.01)
  *H01L 29/78* (2006.01)
  *H01L 29/872* (2006.01)
  *H01L 29/861* (2006.01)

(52) U.S. Cl.
  CPC ...... *H01L 29/7813* (2013.01); *H01L 29/8613* (2013.01); *H01L 29/872* (2013.01)

(56) References Cited

U.S. PATENT DOCUMENTS

| | | | |
|---|---|---|---|
| 2015/0325659 A1* | 11/2015 | Hitora | H01L 29/04 257/43 |
| 2016/0002823 A1 | 1/2016 | Sasaki et al. | |
| 2016/0043238 A1 | 2/2016 | Takizawa et al. | |
| 2016/0322467 A1 | 11/2016 | Takizawa et al. | |
| 2017/0162655 A1 | 6/2017 | Takizawa et al. | |
| 2017/0200790 A1* | 7/2017 | Hitora | H01L 29/7787 |
| 2019/0067426 A1 | 2/2019 | Sugimoto et al. | |
| 2020/0194560 A1 | 6/2020 | Takizawa et al. | |
| 2021/0043778 A1* | 2/2021 | Lv | H01L 29/872 |
| 2022/0149158 A1 | 5/2022 | Takizawa et al. | |

OTHER PUBLICATIONS

Zhang et al., "Effect of annealing atmosphere on the structural and optical properties of the Nb-doped β-Ga2O3 films", Micro & Nano Letters, 2019, vol. 14, Iss. 1, pp. 62-65 (Year: 2019).*
Oda et al., "Schottky barrier diodes of corundum-structured gallium oxide showing on-resistance of 0.1mΩ&cm2 grown by Mist Epitaxy", Applied Physics Express, vol. 9, p. 021101-1-p. 021101-3, 2016.
Sasaki et al., "Doping-Induced Lattice Mismatch and Misorientation in 4H-SiC Crystals", Materials Science Forum, vols. 717-720, pp. 481-484, 2012.

* cited by examiner

SEMICONDUCTOR DEVICE AND METHOD FOR MANUFACTURING THE SAME

CROSS REFERENCE TO RELATED APPLICATION

The present application claims the benefit of priority from Japanese Patent Application No. 2020-157824 filed on Sep. 18, 2020. The entire disclosure of the above application is incorporated herein by reference.

TECHNICAL FIELD

The techniques disclosed herein relate to a semiconductor device and a method for manufacturing the same.

BACKGROUND

According to a conceivable technique, a semiconductor device is made of a gallium oxide-based semiconductor. This semiconductor device has an n-type semiconductor layer and an i-type semiconductor layer. The i-type semiconductor layer is formed on the n-type semiconductor layer by CVD (chemical vapor deposition). The donor concentration in the i-type semiconductor layer is lower than the donor concentration in the n-type semiconductor layer.

SUMMARY

According to an example, a semiconductor device includes: a first semiconductor layer having an N conductive type and made of a gallium oxide-based semiconductor; and a second semiconductor layer made of a gallium oxide-based semiconductor, in contact with the first semiconductor layer, and having the N conductive type with an electrically active donor concentration higher than an electrically active donor concentration of the first semiconductor layer. A difference between a donor concentration of the first semiconductor layer and a donor concentration of the second semiconductor layer is smaller than a difference between the electrically active donor concentration of the first semiconductor layer and the electrically active donor concentration of the second semiconductor layer.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In a gallium oxide-based semiconductor as in the conceivable technique, cracks are likely to occur at the interface of the semiconductor layer. Further, in the semiconductor device of the conceivable technique, the difference in lattice constant is large between the n-type semiconductor layer having a high donor concentration and the i-type semiconductor layer having a low donor concentration. Since the semiconductor layers having significantly different lattice constants are in contact with each other, a high stress is generated at the interface between the n-type semiconductor layer and the i-type semiconductor layer. Therefore, in the semiconductor device of the conceivable technique, cracks are likely to occur at the interface between the n-type semiconductor layer and the i-type semiconductor layer. For example, cracks may occur at the interface between the n-type semiconductor layer and the i-type semiconductor layer when the temperature of the semiconductor substrate changes during the manufacturing process or the usage of the semiconductor device. This embodiment proposes a technique for suppressing cracks at the interface between two semiconductor layers having different carrier concentrations in a semiconductor device made of a gallium oxide-based semiconductor.

The semiconductor device disclosed in the present embodiment has a first semiconductor layer and a second semiconductor layer. The first semiconductor layer is an n-type semiconductor layer made of a gallium oxide-based semiconductor. The second semiconductor layer is made of a gallium oxide-based semiconductor, is in contact with the first semiconductor layer, and is an n-type semiconductor layer having an electrically active donor concentration higher than the electrically active donor concentration of the first semiconductor layer. The difference between the donor concentration of the first semiconductor layer and the donor concentration of the second semiconductor layer is smaller than the difference between the electrically active donor concentration of the first semiconductor layer and the electrically active donor concentration of the second semiconductor layer.

The gallium oxide-based semiconductor is a semiconductor made of a compound including gallium and oxygen. The gallium oxide-based semiconductor includes, for example, $Ga_2O_3$, $(InAlGa)_2O_3$ and the like.

Further, the electrically active donor concentration means the concentration of an electrically active donor among the donors included in the semiconductor.

Further, in the present embodiment, "the difference between the donor concentration of the first semiconductor layer and the donor concentration of the second semiconductor layer" and "the electrically active donor concentration of the first semiconductor layer and the electrically active donor concentration of the second semiconductor layer" means an absolute value of the difference.

In this semiconductor device, the concentration of the electrically active donor in the second semiconductor layer is higher than the concentration of the electrically active donor in the first semiconductor layer. Therefore, the carrier concentration of the second semiconductor layer is higher than the carrier concentration of the first semiconductor layer. That is, this semiconductor device has a structure in which the first semiconductor layer and the second semiconductor layer having different carrier concentrations are in contact with each other. Further, in this semiconductor device, the difference between the donor concentration of the first semiconductor layer and the donor concentration of the second semiconductor layer is smaller than the difference between the electrically active donor concentration of the first semiconductor layer and the electrically active donor concentration of the second semiconductor layer. That is, the difference in donor concentration between the first semiconductor layer and the second semiconductor layer is not as large as the difference in the electrical active donor concentration between them. Therefore, the difference in lattice constant between the first semiconductor layer and the second semiconductor layer is relatively small. Therefore, the stress generated at the interface between the first semiconductor layer and the second semiconductor layer is small. Therefore, the occurrence of cracks at the interface between the first semiconductor layer and the second semiconductor layer is suppressed. In this way, by providing a difference in the electrical active donor concentration between the first semiconductor layer and the second semiconductor layer while reducing the difference in the donor concentration therebetween, the difference is provided in a carrier concentration between the first semiconductor layer and the second semiconductor layer, and it is possible to suppress the stress generated at the interface between them.

The technical elements disclosed herein are listed below. The following technical elements are useful independently.

In an example semiconductor device disclosed in the present embodiment, the first semiconductor layer may include a transition layer in contact with the second semiconductor layer, and a drift layer in contact with the transition layer and separated from the second semiconductor layer by the transition layer. The electrical active donor concentration of the second semiconductor layer may be $1 \times 10^{18}/cm^3$ or more. The electrical active donor concentration in the transition layer may be less than $1 \times 10^{18}/cm^3$. The electrically active donor concentration of the drift layer may be less than the electrically active donor concentration of the transition layer. The concentration of the electrically active donor in the transition layer may be distributed so as to decrease from the second semiconductor layer toward the drift layer. In the stacking direction of the second semiconductor layer, the transition layer, and the drift layer, the rate of change in the concentration of the electrically active donor in the transition layer may be $1 \times 10^{15}/cm^3$ or more per 1 μm. In the stacking direction, the rate of change of the electrically active donor concentration in the drift layer may be less than $1 \times 10^{15}/cm^3$ per 1 μm. The thickness of the transition layer may be 0.1 μm or more.

By providing a thick transition layer in which the concentration of the electrically active donor changes at the interface between the first semiconductor layer and the second semiconductor layer in this way, the stress generated at the interface between the first semiconductor layer and the second semiconductor layer is more effectively suppressed.

The semiconductor device of the example disclosed in the present embodiment may be manufactured by the following manufacturing method. This manufacturing method may include a step of reducing the concentration of electrically active donors in a part of the semiconductor substrate by annealing an n-type semiconductor substrate made of a gallium oxide-based semiconductor. In this step, in the semiconductor substrate, a first semiconductor layer including the region in which the electrically active donor concentration is reduced, and a second semiconductor layer having a higher electrical active donor concentration than the first semiconductor layer and in contact with the first semiconductor layer may be formed.

According to this manufacturing method, the difference between the donor concentration of the first semiconductor layer and the donor concentration of the second semiconductor layer can be reduced smaller than the difference between the electrically active donor concentration of the first semiconductor layer and the electrically active donor concentration of the second semiconductor layer. Therefore, cracks at the interface between the first semiconductor layer and the second semiconductor layer can be suppressed.

In an example manufacturing method disclosed herein, the step of annealing the semiconductor substrate may include a step of annealing the semiconductor substrate in an atmosphere including oxygen.

In an example manufacturing method disclosed herein, the step of annealing the semiconductor substrate may include a step of implanting oxygen ions into the semiconductor substrate and a step of annealing the semiconductor substrate before the step of implanting the oxygen ions.

In an example manufacturing method disclosed herein, the step of annealing the semiconductor substrate may include a step of implanting at least one ion, selected from the group consisting of H, Li, Be, N, Na, Mg, P, S, K, Ca, Cr, Mn, Fe, Co, Ni, Cu, Zn, As, Se, Rb, Sr, Ru, Rh, Pd, Ag, Cd, Sb, Te, Cs, Ba, Ir, Pt, Au, Hg, Tl, Pb, Bi, Po, Fr, and Ra, into the semiconductor substrate, and a step of annealing the semiconductor substrate after the step of implanting at least one ion into the semiconductor substrate.

According to these manufacturing methods, it is possible to reduce the electrically active donor concentration in a part of the region in the semiconductor substrate (the region to be the first semiconductor layer) while suppressing the decrease in the donor concentration in the region.

In the manufacturing method of the example disclosed in the present embodiment, the semiconductor substrate may be made of a β-type gallium oxide-based semiconductor. In this case, the interface between the first semiconductor layer and the second semiconductor layer may extend along the (001) plane or the (100) plane.

In the β-type gallium oxide-based semiconductor, cleavage is likely to occur along the (001) plane or the (100) plane. By applying the technique disclosed in the present embodiment to the first semiconductor layer and the second semiconductor layer in which the interface extends along the (001) plane or the (100) plane as described above, it is possible to suppress the generation of stress at the interface which is easily cracked.

First Embodiment

Figure 1:
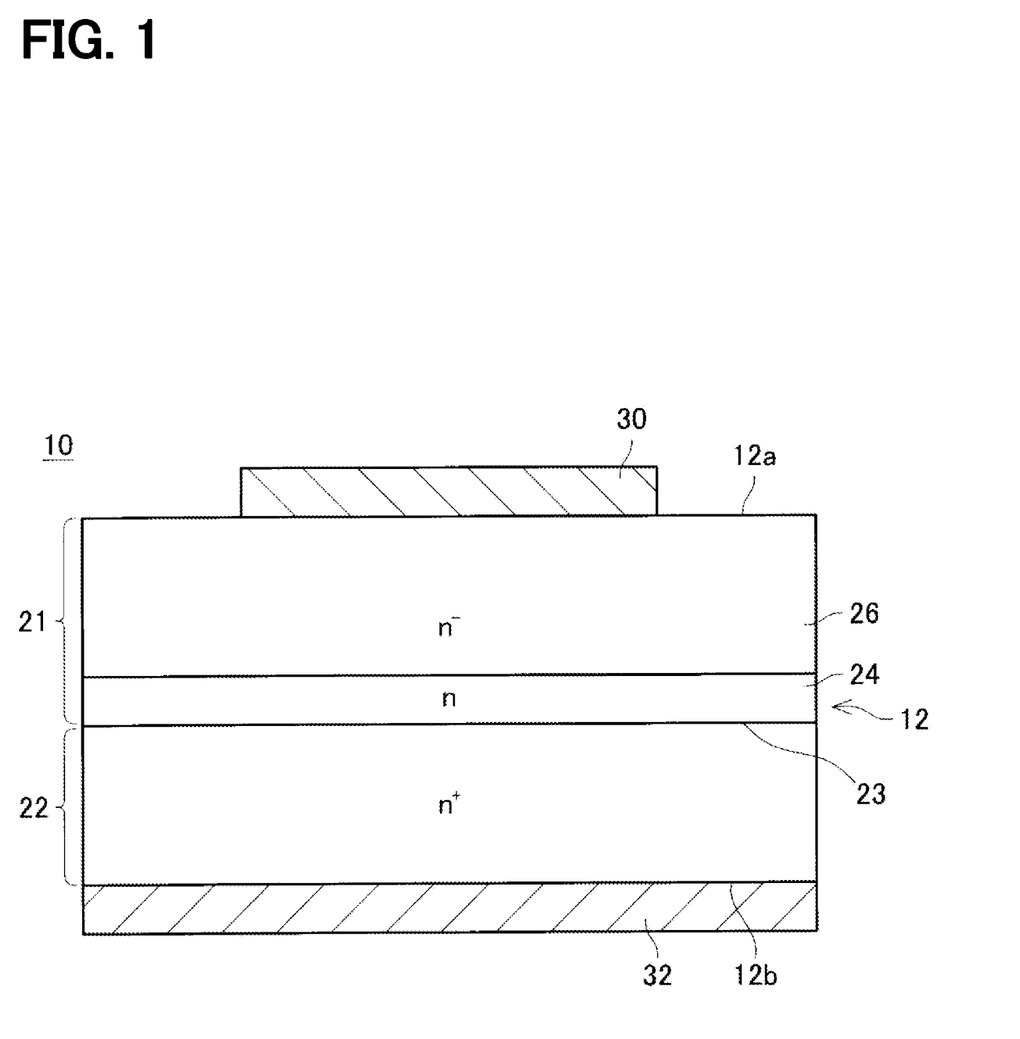
FIG. 1 is a cross-sectional view of a semiconductor device 10.

The semiconductor device 10 shown in FIG. 1 is a Schottky barrier diode. The semiconductor device 10 has a semiconductor substrate 12, an upper electrode 30, and a lower electrode 32. The semiconductor substrate 12 is made of β-type gallium oxide (β-$Ga_2O_3$). The semiconductor substrate 12 may be made of another gallium oxide-based semiconductor (for example, $\alpha\text{-Ga}_2\text{O}_3$, $(\text{InAlGa})_2\text{O}_3$, and the like). The upper electrode 30 is in contact with the upper surface 12a of the semiconductor substrate 12. The lower electrode 32 is in contact with the lower surface 12b of the semiconductor substrate 12.

The semiconductor substrate 12 has a first semiconductor layer 21 and a second semiconductor layer 22. The first semiconductor layer 21 and the second semiconductor layer 22 are n-type. The first semiconductor layer 21 is arranged on the second semiconductor layer 22. Hereinafter, the interface between the first semiconductor layer 21 and the second semiconductor layer 22 is referred to as an interface 23. The first semiconductor layer 21 and the second semiconductor layer 22 include at least one of Si (silicon), Sn (tin), and Ge (germanium) as donors. As will be described in detail later, the concentration of the electrically active donor in the second semiconductor layer 22 is higher than the concentration of the electrically active donor in the first semiconductor layer 21.

The second semiconductor layer 22 is provided in a range including the lower surface 12b of the semiconductor substrate 12. The lower electrode 32 is in ohmic contact with the second semiconductor layer 22. The first semiconductor layer 21 has a transition layer 24 and a drift layer 26. The transition layer 24 is arranged on the second semiconductor layer 22. The drift layer 26 is arranged on the transition layer 24. That is, the transition layer 24 is arranged between the drift layer 26 and the second semiconductor layer 22. The transition layer 24 is in contact with the second semiconductor layer 22 and is in contact with the drift layer 26. The drift layer 26 is separated from the second semiconductor layer 22 by the transition layer 24. The electrical active donor concentration of the transition layer 24 is less than the electrical active donor concentration of the second semiconductor layer 22. The electrically active donor concentration of the drift layer 26 is less than the electrically active donor concentration of the transition layer 24. The drift layer 26 is provided in a range including the upper surface 12a of the semiconductor substrate 12. The upper electrode 30 is in Schottky contact with the drift layer 26.

A Schottky barrier diode is formed by an upper electrode 30, a lower electrode 32, and a semiconductor substrate 12. When the potential of the upper electrode 30 is higher than the potential of the lower electrode 32, the Schottky barrier diode turns on, and when the potential of the upper electrode 30 is lower than the potential of the lower electrode 32, the Schottky barrier diode turns off. When the Schottky barrier diode turns on, a current flows from the upper electrode 30 to the lower electrode 32 via the drift layer 26, the transition layer 24, and the second semiconductor layer 22. In this way, when the Schottky barrier diode turns on, a current flows in the thickness direction of the semiconductor substrate 12. The electrical characteristics of the semiconductor substrate 12 change depending on the relationship between the direction in which the current flows and the crystal orientation of the semiconductor substrate 12. The upper surface 12a of the semiconductor substrate 12 extends along the (001) plane or the (100) plane. As a result, the occurrence of loss in the path of the current flowing in the thickness direction of the semiconductor substrate 12 is suppressed.

Figure 2:
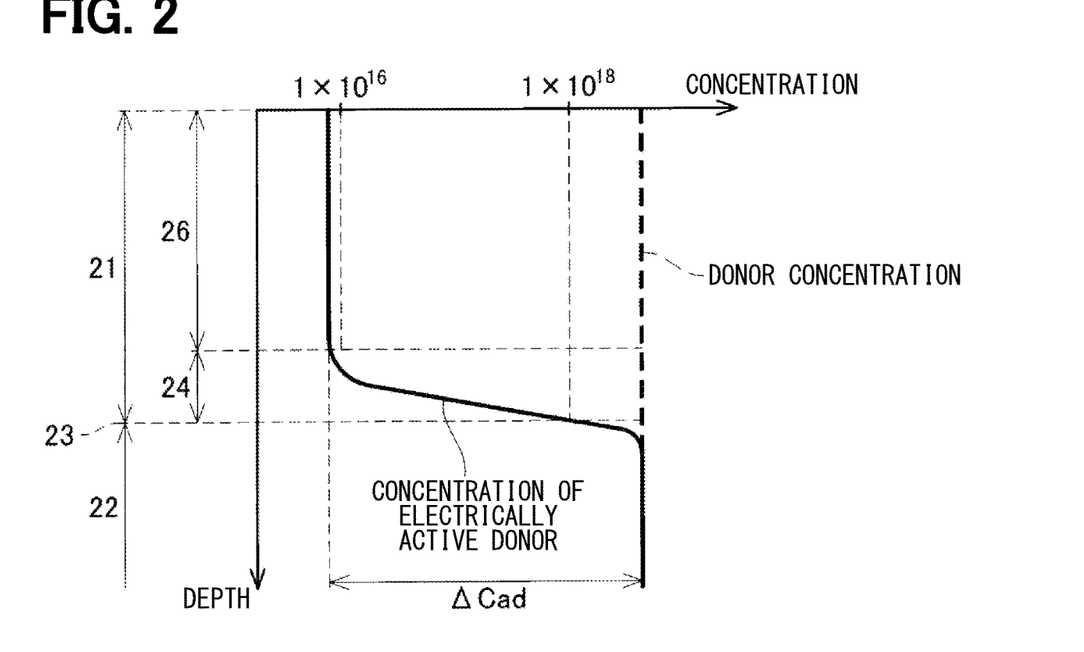
FIG. 2 is a graph showing the distribution of the donor concentration and the electrically active donor concentration in the semiconductor substrate 12 in the stacking direction.

FIG. 2 shows the distribution of the donor concentration and the distribution of the electrically active donor concentration in the stacking direction (hereinafter, simply referred to as the stacking direction) of the second semiconductor layer 22, the transition layer 24, and the drift layer 26. The donor concentration is the concentration of donors (that is, Si, Sn, and Ge) included in the semiconductor substrate 12. The donors included in the semiconductor substrate 12 include electrically active donors and electrically inactive donors. An electrically active donor is one that contributes to the generation of electrons as carriers. Electrically inactive donors are donors that do not contribute to the generation of electrons as carriers. The electrically active donor concentration is the concentration of the electrically active donor included in the semiconductor substrate 12. As shown in FIG. 2, the electrically active donor concentration of the second semiconductor layer 22 is $1\times10^{18}/\text{cm}^3$ or more, and the electrically active donor concentration of the first semiconductor layer 21 is less than $1\times10^{18}/\text{cm}^3$. In the second semiconductor layer 22, the electrically active donor concentration is distributed at a substantially constant value. In the drift layer 26, the electrically active donor concentration is a value near $1\times10^{16}/\text{cm}^3$. In the drift layer 26, the electrically active donor concentration is distributed at a substantially constant value. Therefore, in the stacking direction, the rate of change of the electrically active donor concentration in the drift layer 26 is less than $1\times10^{15}/\text{cm}^3$ per 1 μm. In the transition layer 24, the electrical active donor concentration is distributed so as to decrease from the second semiconductor layer 22 toward the drift layer 26. In the stacking direction, the rate of change in the concentration of electrically active donors in the transition layer 24 is $1\times10^{15}/\text{cm}^3$ or more per 1 μm. As described above, the transition layer 24 is a layer in which the concentration of the electrically active donor changes between the drift layer 26 and the second semiconductor layer 22. The thickness of the transition layer 24 is 0.1 μm or more. Reference numeral ΔCad in FIG. 2 indicates the difference between the electrically active donor concentration of the first semiconductor layer 21 and the electrically active donor concentration of the second semiconductor layer 22. As described above, the concentration of electrically active donors in the first semiconductor layer 21 (particularly, the drift layer 26) is much smaller than the concentration of electrically active donors in the second semiconductor layer 22. Therefore, the difference ΔCad in the concentration of electrically active donors is large.

As shown in FIG. 2, in the second semiconductor layer 22, the transition layer 24, and the drift layer 26, the donor concentration is distributed at a substantially constant value of $1\times10^{18}/\text{cm}^3$ or more. That is, the donor concentrations are substantially equal between the second semiconductor layer 22, the transition layer 24, and the drift layer 26. Therefore, the difference ΔCd between the donor concentration of the first semiconductor layer 21 and the donor concentration of the second semiconductor layer 22 is substantially zero. Therefore, the difference ΔCd between the donor concentration of the first semiconductor layer 21 and the donor concentration of the second semiconductor layer 22 is smaller than the difference ΔCad between the electrically active donor concentration of the first semiconductor layer 21 and the electrically active donor concentration of the second semiconductor layer 22. In the second semiconductor layer 22, the electrically active donor concentration is substantially equal to the donor concentration. Within the first semiconductor layer 21, the electrically active donor concentration is lower than the donor concentration.

As described above, in the semiconductor device 10, the difference ΔCd between the donor concentration of the first semiconductor layer 21 and the donor concentration of the second semiconductor layer 22 is substantially zero. Therefore, the difference in lattice constant between the first semiconductor layer 21 and the second semiconductor layer 22 is extremely small. Therefore, the stress generated at the interface 23 between the first semiconductor layer 21 and the second semiconductor layer 22 (that is, the interface between the transition layer 24 and the second semiconductor layer 22) is small. In this way, by increasing the difference ΔCad in electrical active donor concentration between the first semiconductor layer 21 and the second semiconductor layer 22 while reducing the difference ΔCd in donor concentration between the first semiconductor layer 21 and the second semiconductor layer 22, it is possible to suppress the stress applied to the interface 23 while providing a difference in electrical characteristics between the first semiconductor layer 21 and the second semiconductor layer 22. Therefore, cracks are unlikely to occur at the interface 23. As described above, the upper surface 12a of the semiconductor substrate 12 is a (001) plane or a (100) plane. Therefore, the interface 23 extends along the (001) plane or the (100) plane. In β-type gallium oxide, cleavage is likely to occur along the (001) plane or the (100) plane. Therefore, when stress is applied to the interface 23, cracks may be likely to occur. By suppressing the stress applied to the interface 23 where cracks may be likely to occur, the reliability of the semiconductor device 10 is greatly improved. Further, in the semiconductor device 10, the transition layer 24 in which the concentration of the electrically active donor changes significantly at the interface 23 has a thickness of 0.1 μm or more. By providing the transition layer 24 thickly in this way, the stress applied to the interface 23 can be suppressed more effectively. Therefore, cracks can be suppressed more effectively at the interface 23.

Figure 3:
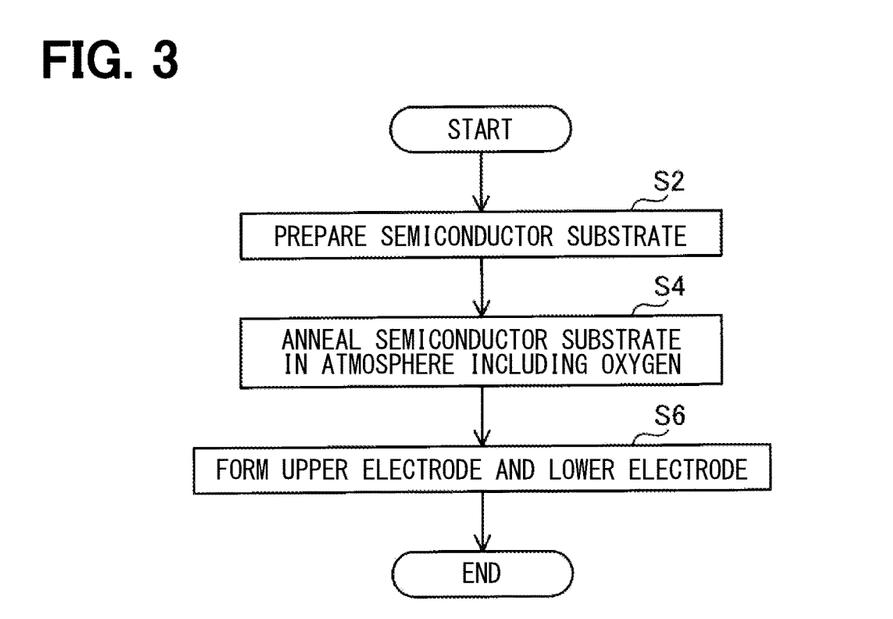
FIG. 3 is a flowchart showing a manufacturing method of the first embodiment.
Figure 4:
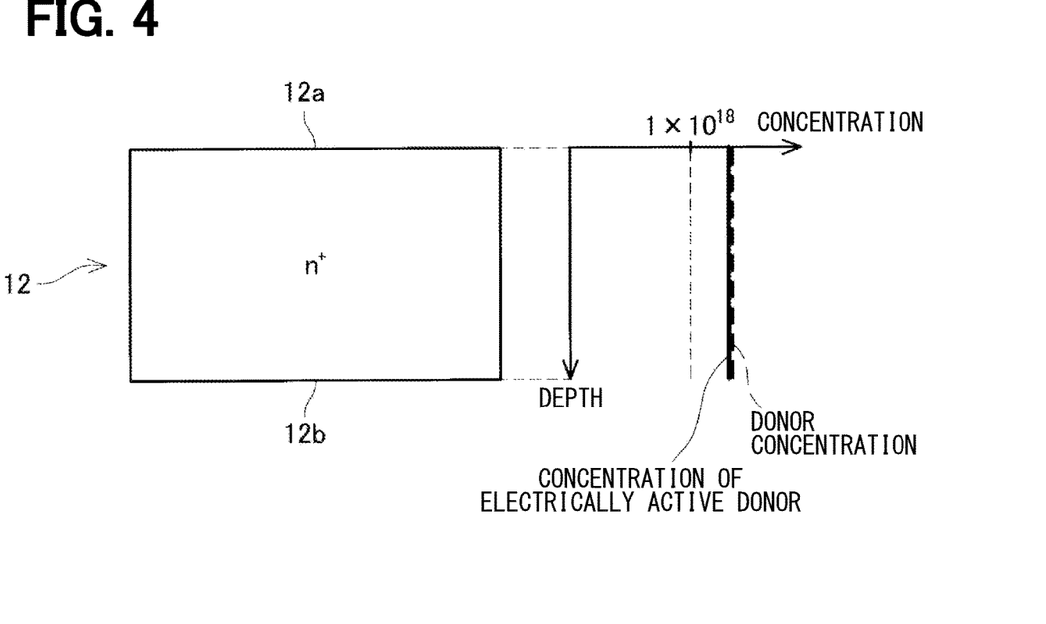
FIG. 4 is a cross-sectional view of the semiconductor substrate 12 before processing and a graph showing distributions of donor concentration and electrically active donor concentration in the stacking direction.

Next, a manufacturing method of the semiconductor device 10 will be described. In the manufacturing method of first embodiment shown in FIG. 3, first, in step S2, a semiconductor substrate 12 made of β-type gallium oxide is prepared. Here, as shown in FIG. 4, a semiconductor substrate 12 having both an electrically active donor concentration of $1\times10^{18}/cm^3$ or more and a donor concentration of $1\times10^{18}/cm^3$ or more in the entire semiconductor substrate 12 is prepared. In the entire semiconductor substrate 12 of FIG. 4, the electrically active donor concentration and the donor concentration are distributed at substantially constant values. The upper surface 12a of the semiconductor substrate 12 of FIG. 4 is formed by a (001) plane or a (100) plane.

Next, in step S4, the semiconductor substrate 12 of FIG. 4 is annealed in an atmosphere including oxygen. The atmosphere including oxygen means an atmosphere including oxygen as an element. For example, the semiconductor substrate 12 can be annealed in an atmosphere of oxygen gas, water vapor, or the like. Here, the semiconductor substrate 12 is annealed in a state where the upper surface 12a of the semiconductor substrate 12 is exposed to an atmosphere including oxygen. Then, oxygen diffuses from the upper surface 12a into the semiconductor substrate 12. When oxygen atoms diffuse into a gallium oxide semiconductor, oxygen affects on the donor and the donor no longer supplies electrons as carriers. That is, oxygen deactivates the donor. As a result, the concentration of the electrically active donor decreases in the region where oxygen is diffused in the semiconductor substrate 12. Here, the concentration of the electrically active donor decreases in the region near the upper surface 12a of the semiconductor substrate 12.

Figure 5:
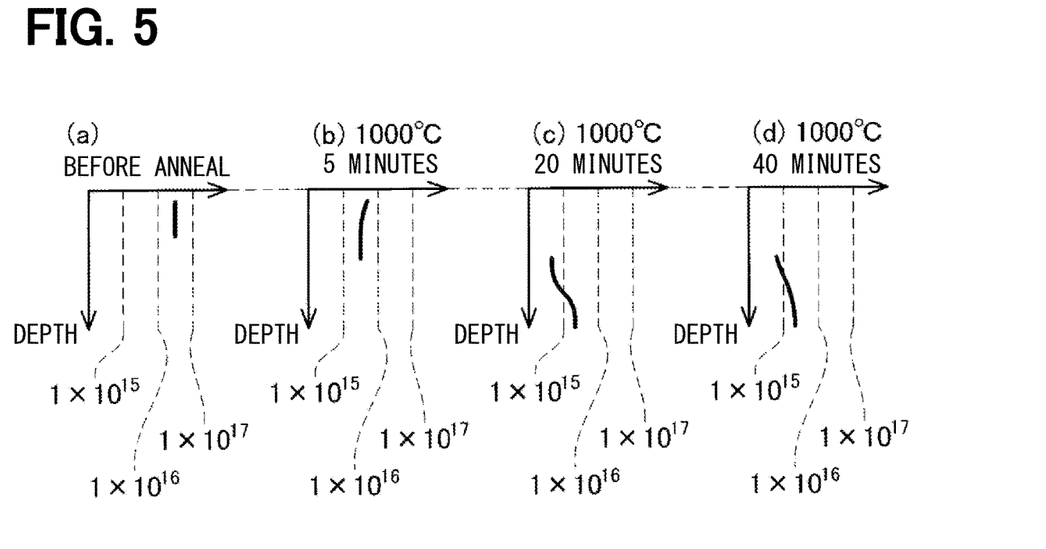
FIG. 5 is a graph showing changes in the concentration of electrically active donors due to annealing.

FIG. 5 shows the result of an experiment in which the semiconductor substrate 12 is annealed in oxygen gas as an example of the above-mentioned annealing step. In each graph of FIG. 5, the vertical axis represents the depth of the semiconductor substrate 12 from the upper surface 12a, and the horizontal axis represents the concentration of electrically active donors. As shown in (a) of FIG. 5, before annealing, the concentration of electrically active donors in the semiconductor substrate 12 is about $2\times10^{16}/cm^3$. As shown in (b) of FIG. 5, in the sample subjected to annealing at 1000° C. for 5 minutes, the concentration of the electrically active donor in the semiconductor substrate 12 decreased to about $7\times10^{15}/cm^3$. Further, as shown in (c) and (d) of FIG. 5, in the sample subjected to the annealing at 1000° C. for 20 minutes and the sample subjected to the annealing at 1000° C. for 40 minutes, the electrical active donor concentration in the semiconductor substrate 12 drops to about $1\times10^{15}/cm^3$. Further, in (c) and (d) of FIG. 5, the concentration of the electrically active donor decreases at a deeper position. As described above, the annealing in the oxygen gas can reduce the concentration of the electrically active donor in the semiconductor substrate 12.

As described above, by annealing the semiconductor substrate 12 in an atmosphere including oxygen, the concentration of the electrically active donor can be reduced in a part of the semiconductor substrate 12. The region where the concentration of the electrically active donor is reduced in the annealing step provides the drift layer 26. Further, the region where the concentration of the electrically active donor does not decrease provides the second semiconductor layer 22. Further, a transition layer 24 in which the concentration of the electrically active donor changes along the stacking direction is formed between the drift layer 26 and the second semiconductor layer 22. Therefore, as shown in FIG. 2, the concentration of the electrically active donor in the drift layer 26, the transition layer 24, and the second semiconductor layer 22 can be distributed. Further, in this annealing step, the donor in the first semiconductor layer 21 becomes inactive, while the inactive donor remains in the first semiconductor layer 21. Therefore, as shown in FIG. 2, in the first semiconductor layer 21, the concentration of the electrically active donor decreases, but the concentration of the donor hardly decreases.

Next, in step S6, the upper electrode 30 and the lower electrode 32 are formed on the surface of the semiconductor substrate 12. As a result, the semiconductor device 10 is completed.

As described above, according to the manufacturing method of First Embodiment, the electrically active donor concentration in the first semiconductor layer 21 (that is, the drift layer 26 and the transition layer 24) is decreased with almost no decrease in the donor concentration. Therefore, there is almost no difference in donor concentration between the first semiconductor layer 21 and the second semiconductor layer 22, and the stress applied to the interface 23 between the first semiconductor layer 21 and the second semiconductor layer 22 can be reduced. Further, according to this manufacturing method, the electrical active donor concentration can be distributed between the first semiconductor layer 21 and the second semiconductor layer 22 so that the electrically active donor concentration changes relatively slowly. The transition layer 24 can be formed relatively thickly. Thereby, the stress applied to the interface 23 can be reduced more effectively. Therefore, according to the manufacturing method of First Embodiment, the occurrence of cracks at the interface 23 can be suppressed.

Second Embodiment

Figure 6:
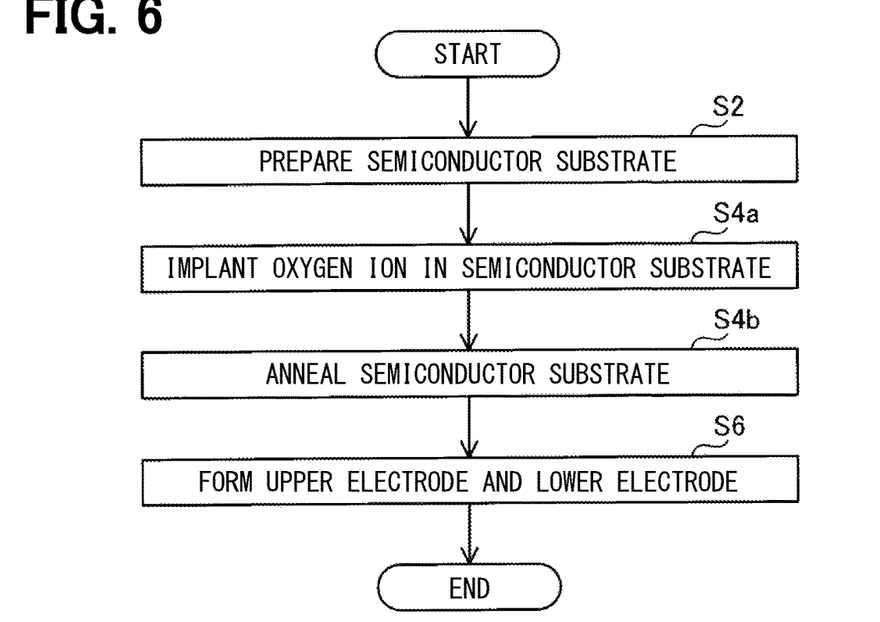
FIG. 6 is a flowchart showing a manufacturing method of the second embodiment.

Next, as a manufacturing method of the semiconductor device 10, the manufacturing method of the second embodiment will be described. In the manufacturing method of Second Embodiment shown in FIG. 6, first, in step S2, the semiconductor substrate 12 of FIG. 4 is prepared in the same manner as in First Embodiment. Next, in step S4a, oxygen ions are implanted into the upper surface 12a of the semiconductor substrate 12. Here, oxygen ions are implanted into a depth range corresponding to the drift layer 26. Next, in step S4b, the semiconductor substrate 12 is annealed. In step S4b, for example, the semiconductor substrate 12 can be annealed in an inert gas. When the semiconductor substrate 12 is annealed, the oxygen implanted into the semiconductor substrate 12 in step S4a affects on the donor, and the donor becomes inactive. This reduces the concentration of electrically active donors in the area in which the oxygen is implanted.

As described above, by implanting oxygen ions into the semiconductor substrate 12 in step S4a and annealing the semiconductor substrate 12 in step S4b, the concentration of the electrically active donor is reduced in a part of the semiconductor substrate 12. The region where the concentration of the electrically active donor is reduced in the annealing step provides the drift layer 26. Further, the region where the concentration of the electrically active donor does not decrease provides the second semiconductor layer 22. Further, a transition layer 24 in which the concentration of the electrically active donor changes along the stacking direction is formed between the drift layer 26 and the second semiconductor layer 22. Therefore, as shown in FIG. 2, the concentration of the electrically active donor in the drift layer 26, the transition layer 24, and the second semiconductor layer 22 can be distributed. Further, in this annealing step, the donor in the first semiconductor layer 21 becomes inactive, while the inactive donor remains in the first semiconductor layer 21. Therefore, as shown in FIG. 2, in the first semiconductor layer 21, the concentration of the electrically active donor decreases, but the concentration of the donor hardly decreases. After that, the semiconductor device 10 is completed by forming the upper electrode 30 and the lower electrode 32 in step S6 in the same manner as in the first embodiment.

As described above, according to the manufacturing method of Second Embodiment, the electrically active donor concentration in the first semiconductor layer 21 (that is, the drift layer 26 and the transition layer 24) is decreased with almost no decrease in the donor concentration. Further, according to this manufacturing method, the transition layer 24 can be formed to be relatively thick. Therefore, the stress applied to the interface 23 can be reduced. Therefore, according to the manufacturing method of Second Embodiment, the occurrence of cracks at the interface 23 can be suppressed.

Third Embodiment

Figure 7:
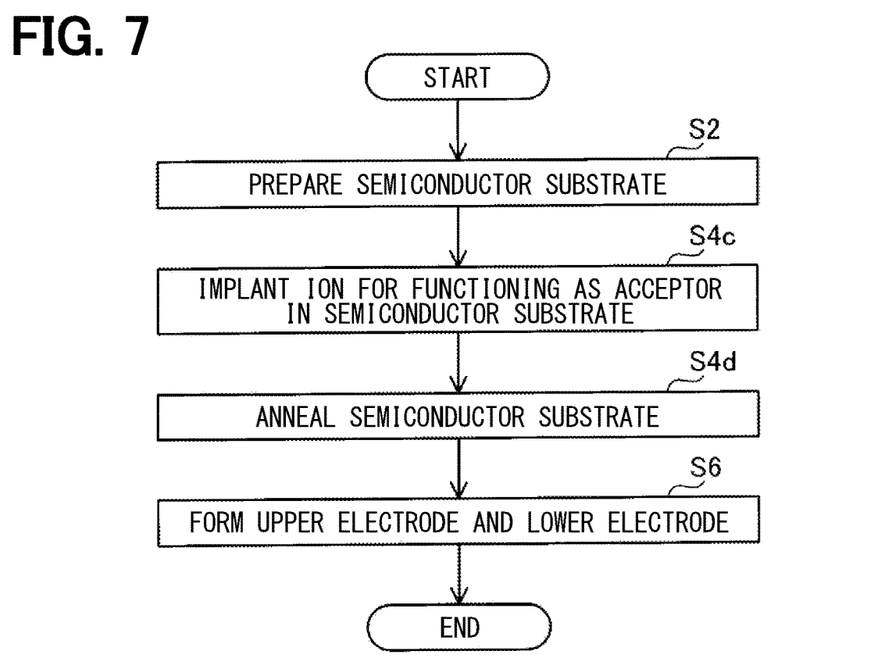
FIG. 7 is a flowchart showing a manufacturing method of the third embodiment.

Next, as a manufacturing method of the semiconductor device 10, the manufacturing method of the Third embodiment will be described. In the manufacturing method of Third Embodiment shown in FIG. 7, first, in step S2, the semiconductor substrate 12 of FIG. 4 is prepared in the same manner as in First Embodiment. Next, in step S4c, ions are implanted into the upper surface 12a of the semiconductor substrate 12. Here, ions that functions as acceptors in gallium oxide-based semiconductors are implanted. The ions implanted here are at least one ion selected from the group consisting of H, Li, Be, N, Na, Mg, P, S, K, Ca, Cr, Mn, Fe, Co, Ni, Cu, Zn, As, Se, Rb, Sr, Ru, Rh, Pd, Ag, Cd, Sb, Te, Cs, Ba, Ir, Pt, Au, Hg, Tl, Pb, Bi, Po, Fr, and Ra. These elements behave like acceptors in gallium oxide-based semiconductors. Next, in step S4d, the semiconductor substrate 12 is annealed. In step S4d, for example, the semiconductor substrate 12 can be annealed in an inert gas. When the semiconductor substrate 12 is annealed, the element implanted into the semiconductor substrate 12 is activated in step S4c and acts like an acceptor. This reduces the concentration of electrically active donors in the ion-implanted region in step S4c.

As described above, by implanting ions into the semiconductor substrate 12 in step S4c and annealing the semiconductor substrate 12 in step S4d, the concentration of the electrically active donor is reduced in a part of the semiconductor substrate 12. The region where the concentration of the electrically active donor is reduced in the annealing step provides the drift layer 26. Further, the region where the concentration of the electrically active donor does not decrease provides the second semiconductor layer 22. Further, a transition layer 24 in which the concentration of the electrically active donor changes along the stacking direction is formed between the drift layer 26 and the second semiconductor layer 22. Therefore, as shown in FIG. 2, the concentration of the electrically active donor in the drift layer 26, the transition layer 24, and the second semiconductor layer 22 can be distributed. In this annealing step, as shown in FIG. 2, the electrically active donor concentration can be reduced in the drift layer 26 and the transition layer 24 with almost no reduction in the donor concentration. After that, the semiconductor device 10 is completed by forming the upper electrode 30 and the lower electrode 32 in step S6 in the same manner as in the first embodiment.

As described above, according to the manufacturing method of Third Embodiment, the electrically active donor concentration in the first semiconductor layer 21 (that is, the drift layer 26 and the transition layer 24) is decreased with almost no decrease in the donor concentration. Further, according to this manufacturing method, the transition layer 24 can be formed to be relatively thick. Therefore, the stress applied to the interface 23 can be reduced. Therefore, according to the manufacturing method of Third Embodiment, the occurrence of cracks at the interface 23 can be suppressed.

Comparative Example

Figure 8:
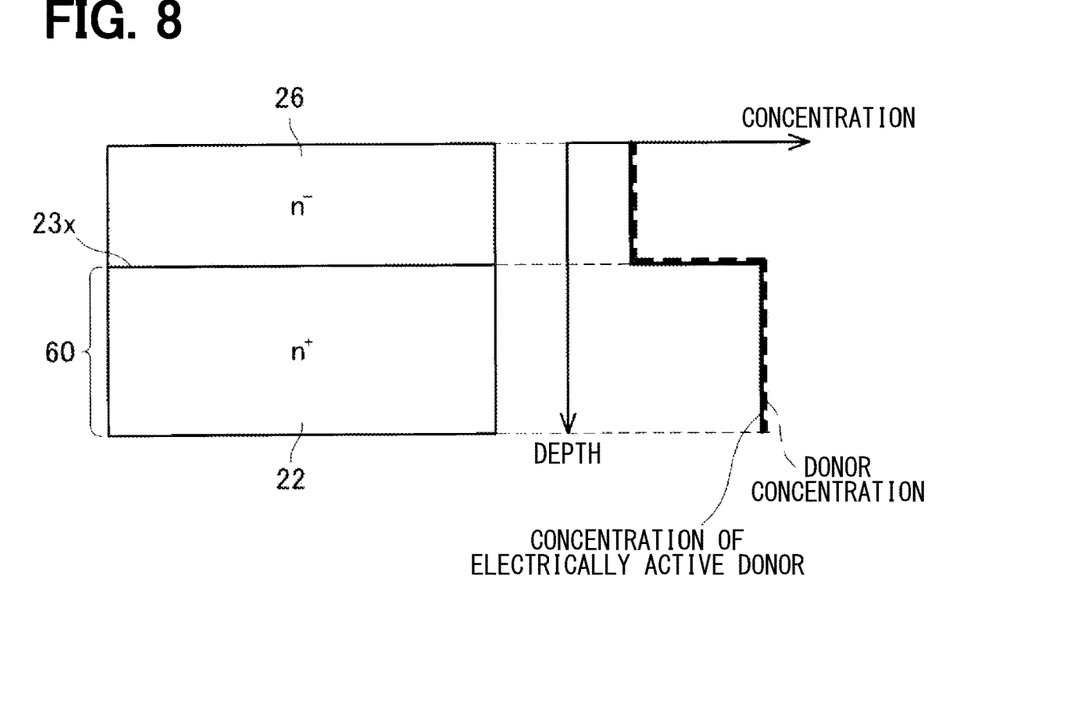
FIG. 8 is a graph showing the distribution of the donor concentration and the electrically active donor concentration in the semiconductor substrate of a comparison example in the stacking direction.

Next, a manufacturing method of the comparative example will be described. In the manufacturing method of the comparative example, as shown in FIG. 8, a semiconductor substrate 60 corresponding to the second semiconductor layer 22 is prepared, and a drift layer 26 having the donor concentration lower than the semiconductor substrate 60 is formed on the semiconductor substrate 60 by epitaxial growth (for example, CVD). When the semiconductor device is manufactured by this manufacturing method, the distributions of the donor concentration and the electrically active donor concentration in the second semiconductor layer 22 and the drift layer 26 are substantially the same. Therefore, at the interface 23x between the second semiconductor layer 22 and the drift layer 26, not only the electrically active donor concentration but also the donor concentration changes sharply. Therefore, the difference in lattice constant between the second semiconductor layer 22 and the drift layer 26 is large, and a high stress is applied to the interface 23x. Further, when the drift layer 26 is formed by epitaxial growth, mutual diffusion of donors is unlikely to occur between the drift layer 26 and the second semiconductor layer 22. Therefore, the rate of change in the donor concentration becomes extremely high at the interface 23x between the drift layer 26 and the second semiconductor layer 22. As a result, the thickness of the transition layer 24 between the drift layer 26 and the second semiconductor layer 22 becomes extremely thin (in FIG. 8, the thickness of the transition layer 24 is substantially zero). Therefore, stress is more likely to be applied to the interface 23x. Further, when the drift layer 26 is formed by epitaxial growth, the crystal continuity between the drift layer 26 and the second semiconductor layer 22 is not so high, so that the strength of the interface 23x is not so high. Since high stress is applied to the interface 23x having low strength as described above, cracks are likely to occur at the interface 23x in the manufacturing method of the comparative example. According to the manufacturing methods of First Embodiment to Third Embodiment described above, it is difficult for a difference in donor concentration to occur between the first semiconductor layer 21 and the second semiconductor layer 22. Further, according to the production methods of First Embodiment to Third Embodiment, a thick transition layer 24 can be formed. Further, in the manufacturing methods of First Embodiment to Third Embodiment, since the second semiconductor layer 22 to the drift layer 26 are continuously formed in bulk semiconductors, the strength of the interface 23 is high. Therefore, according to the manufacturing methods of First Embodiment to Third Embodiment, the occurrence of cracks at the interface 23 can be suppressed as compared with the manufacturing methods of Comparative Examples.

Further, in the manufacturing method of the comparative example, it takes a long time to epitaxially grow the drift layer 26. In addition, high temperature is required for epitaxial growth. Therefore, in the manufacturing method of the comparative example, the manufacturing cost of the semiconductor device is high. On the other hand, in the manufacturing methods of First Embodiment to Third Embodiment, since epitaxial growth is not used for forming the drift layer 26, the semiconductor device 10 can be manufactured at low cost.

Further, in the manufacturing method of the comparative example, when the drift layer 26 is epitaxially grown, crystal defects may grow along the growth direction. Therefore, a defect extending along the thickness direction of the drift layer 26 occurs. On the other hand, in the manufacturing methods of First Embodiment to Third Embodiment, since epitaxial growth is not used for forming the drift layer 26, the occurrence of defects in the drift layer 26 can be suppressed.

Further, in the manufacturing method of the comparative example, when the drift layer 26 is epitaxially grown, the donor concentration may vary in the plane. On the other hand, in the production methods of First Embodiment to Third Embodiment, since epitaxial growth is not used for forming the drift layer 26, it is possible to suppress variations in the donor concentration and the electrically active donor concentration in the plane of the drift layer 26.

Figure 9:
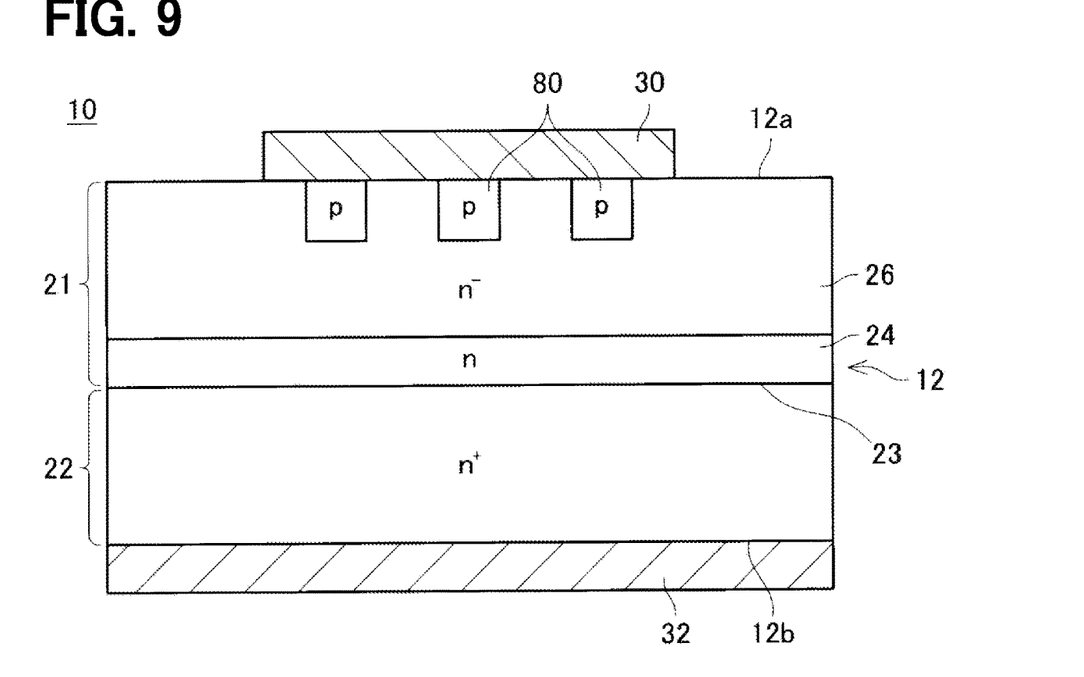
FIG. 9 is a cross-sectional view showing an example in which the structure of the embodiment is applied to a junction barrier Schottky diode.
Figure 10:
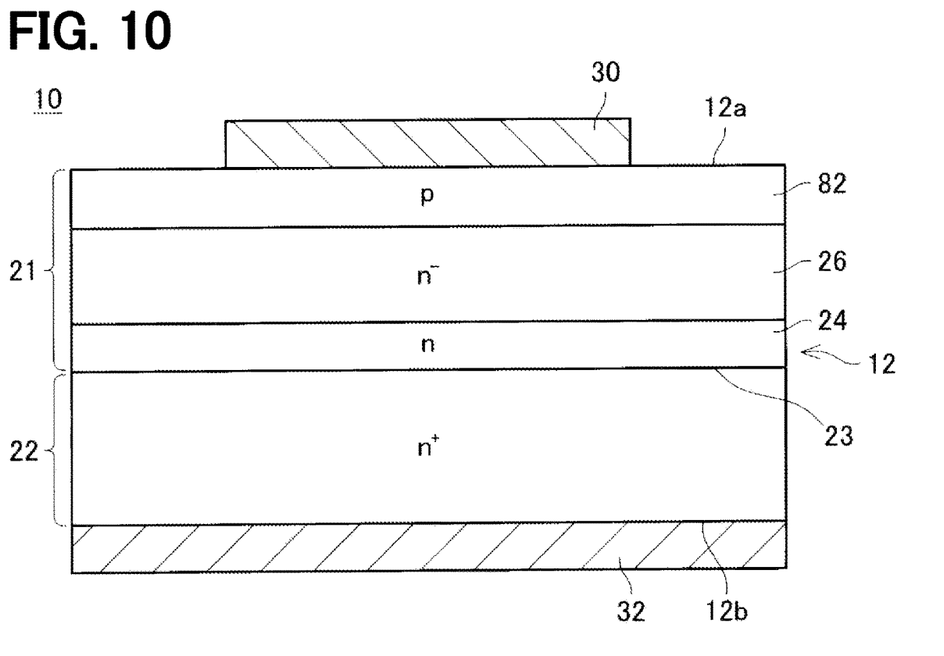
FIG. 10 is a cross-sectional view showing an example in which the structure of the embodiment is applied to a pn diode.
Figure 11:
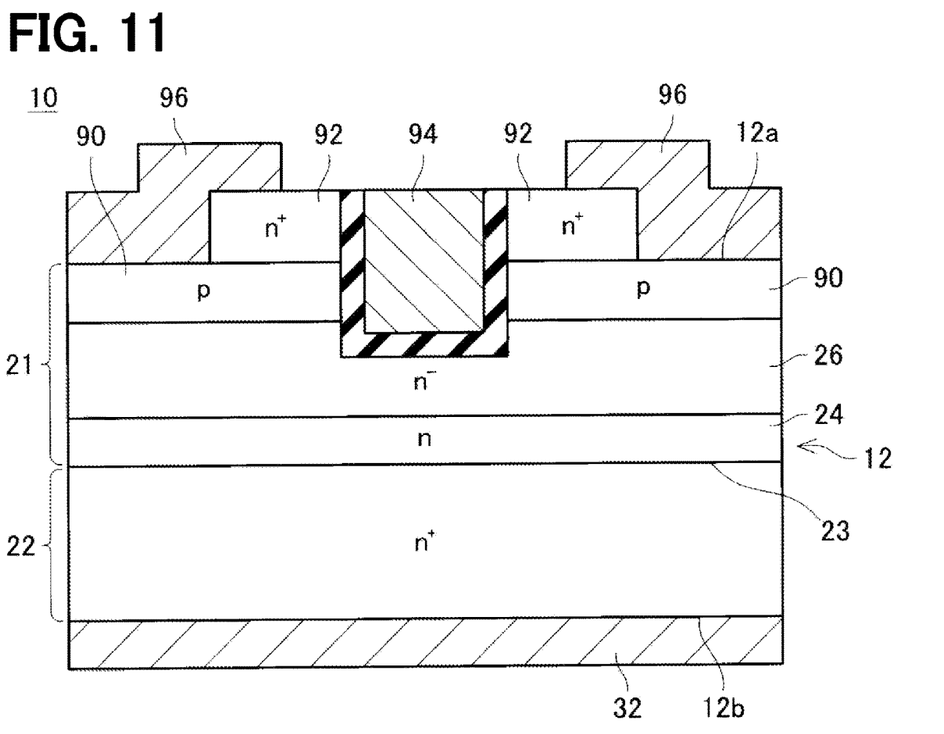
FIG. 11 is a cross-sectional view showing an example in which the structure of the embodiment is applied to a MOSFET.

In the above-described embodiment, the Schottky barrier diode has been described as the semiconductor device 10. Alternatively, the techniques disclosed herein may be applied to other semiconductor devices. For example, as shown in FIG. 9, the junction barrier Schottky diode may be configured by partially providing the p-type layer 80 in the range in contact with the upper electrode 30. Further, for example, as shown in FIG. 10, the pn diode may be configured by providing the p-type layer 82 in the entire range in contact with the upper electrode 30. Further, as shown in FIG. 11, MOSFET (metal oxide semiconductor field effect transistor) may be provided by providing a p-type body layer 90, an n-type source layer 92, a gate electrode 94, a source electrode 96, and the like on the drift layer 26. The p-type layer of the semiconductor device shown in FIGS. 9 to 11 can be formed by p-type ion implantation, embedded epiepitaxial growth, or the like. These p-type layers may be made of a material different from that of the drift layer 26. Further, the source layer 92 of FIG. 11 may be formed by implantation of n-type ions, or may be formed by reactivating the donor by performing local annealing in an inert atmosphere. Further, the technique disclosed in the present embodiments may be applied to other semiconductor devices such as JFET (junction field effect transistor) and HEMT (high electron mobility transistor).

Further, in the above-described embodiment, the donor concentration is equal between the first semiconductor layer 21 and the second semiconductor layer 22. Alternatively, the donor concentration of the first semiconductor layer 21 may be higher than the donor concentration of the second semiconductor layer 22, and the donor concentration of the first semiconductor layer 21 may be lower than the donor concentration of the second semiconductor layer 22. As long as the condition is satisfied that "the difference $\Delta Ca$ between the donor concentration of the first semiconductor layer 21 and the donor concentration of the second semiconductor layer 22 is smaller than the difference $\Delta Cad$ between the electrically active donor concentration of the first semiconductor layer 21 and the electrically active donor concentration of the second semiconductor layer 22," the donor concentration of the first semiconductor layer 21 and the donor concentration of the second semiconductor layer 22 may be distributed in any way.

Further, the above-described steps in the manufacturing directions of First Embodiment to Third Embodiment may be combined and executed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a first semiconductor layer having an N conductive type and made of a gallium oxide-based semiconductor; and
   a second semiconductor layer made of a gallium oxide-based semiconductor, in contact with the first semiconductor layer, and having the N conductive type with an electrically active donor concentration higher than an electrically active donor concentration of the first semiconductor layer, wherein:
   a difference between a donor concentration of the first semiconductor layer and a donor concentration of the second semiconductor layer is smaller than a difference between the electrically active donor concentration of the first semiconductor layer and the electrically active donor concentration of the second semiconductor layer,
   the first semiconductor layer includes:
      a transition layer in contact with the second semiconductor layer; and
      a drift layer in contact with the transition layer and separated from the second semiconductor layer by the transition layer;
   the electrically active donor concentration of the second semiconductor layer is $1\times10^{18}/cm^3$ or more;

the electrically active donor concentration in the transition layer is less than $1\times10^{18}/cm^3$;

the electrically active donor concentration of the drift layer is less than the electrically active donor concentration of the transition layer;

the electrically active donor concentration in the transition layer is distributed to decrease from the second semiconductor layer toward the drift layer;

in a stacking direction of the second semiconductor layer, the transition layer, and the drift layer, a rate of change in the electrically active donor concentration in the transition layer is $1\times10^{15}/cm^3$ or more per 1 µm;

in the stacking direction, the rate of change of the electrically active donor concentration in the drift layer is less than $1\times10^{15}/cm^3$ per 1 µm; and a thickness of the transition layer is 0.1 µm or more.

2. The semiconductor device according to claim 1, wherein the semiconductor substrate further comprises dopants consisting of at least one element selected from the group consisting of H, Li, Be, N, Na, Mg, P, S, K, Ca, Cr, Mn, Fe, Co, Ni, Cu, Zn, As, Se, Rb, Sr, Ru, Rh, Pd, Ag, Cd, Sb, Te, Cs, Ba, Ir, Pt, Au, Hg, Tl, Pb, Bi, Po, Fr, and Ra.

3. The semiconductor device according to claim 1, wherein the semiconductor substrate is made of a β-type gallium oxide-based semiconductor.

4. The semiconductor device according to claim 1, wherein an interface between the first semiconductor layer and the second semiconductor layer extends along a (001) plane or a (100) plane.

\* \* \* \* \*